United States Patent
Wu

(10) Patent No.: US 8,669,784 B1
(45) Date of Patent: Mar. 11, 2014

(54) PROGRAMMABLE PULSE GENERATOR USING INVERTER CHAIN

(75) Inventor: Kai Wu, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/448,176

(22) Filed: Apr. 16, 2012

Related U.S. Application Data

(60) Provisional application No. 61/487,539, filed on May 18, 2011.

(51) Int. Cl.
*H03K 19/00* (2006.01)
*H03K 3/017* (2006.01)

(52) U.S. Cl.
USPC ............... 326/93; 326/96; 327/172; 327/299

(58) Field of Classification Search
USPC ............................................. 326/94; 327/41
See application file for complete search history.

(56) References Cited

U.S. PATENT DOCUMENTS

| | | | | |
|---|---|---|---|---|
| 5,642,068 | A  * | 6/1997 | Wojcicki et al. | 327/172 |
| 6,204,694 | B1 * | 3/2001 | Sunter et al. | 326/93 |
| 6,204,714 | B1 * | 3/2001 | Milshtein et al. | 327/299 |
| 6,320,437 | B1 * | 11/2001 | Ma | 327/175 |
| 6,346,836 | B1 * | 2/2002 | Wieberneit et al. | 327/144 |
| 7,319,355 | B2 * | 1/2008 | Wu et al. | 327/291 |
| 7,443,211 | B2 * | 10/2008 | Liu | 327/108 |
| 7,872,516 | B2 * | 1/2011 | Masleid et al. | 327/299 |
| 8,294,502 | B2 * | 10/2012 | Lewis | 327/261 |

* cited by examiner

*Primary Examiner* — Douglas W Owens
*Assistant Examiner* — Nelson Correa

(57) ABSTRACT

In one embodiment, a method includes generating a first signal based on a clock signal and generating a second signal based on a programmable delayed clock signal. The method then generates a reset signal based on the first signal and the second signal. The clock signal is delayed using an inverter chain to generate a delayed version of the clock signal. An output signal is generated based on the delayed version of the clock signal and the reset signal. When a pulse width of the output signal is greater than a data duration determined from the clock signal, the pulse width of the output signal is reset to the pulse width of the data duration.

18 Claims, 7 Drawing Sheets

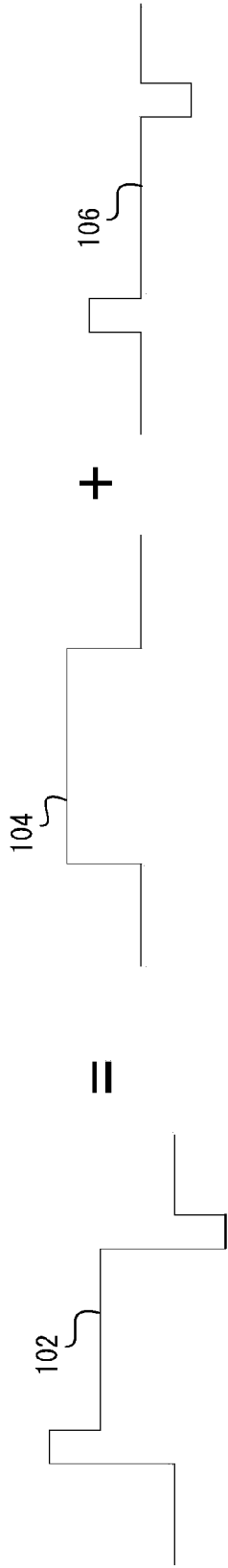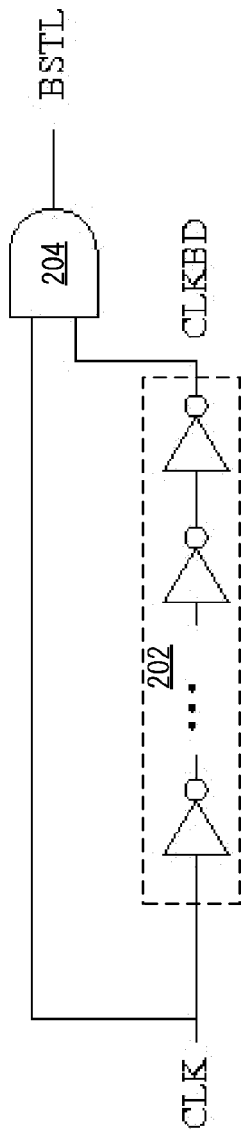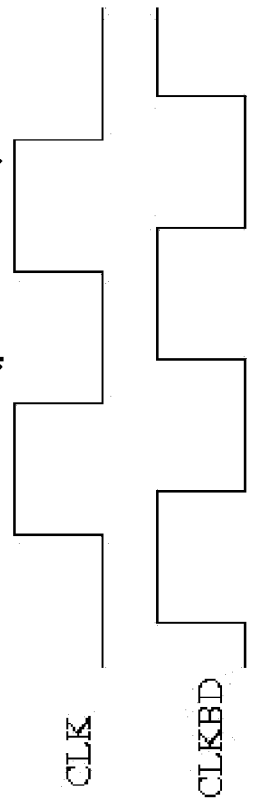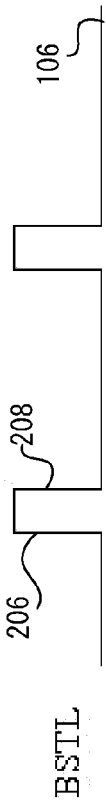
FIG. 1 (prior art)
FIG. 2A (prior art)
FIG. 2B (prior art)

PROGRAMMABLE PULSE GENERATOR USING INVERTER CHAIN

CROSS-REFERENCE TO RELATED APPLICATIONS

The present disclosure claims priority to U.S. Provisional App. No. 61/487,539 for "Programmable Pulse Generation Using Inverter Chain with Reset Capability" filed May 18, 2011, which is incorporated herein by reference in its entirety for all purposes.

BACKGROUND

Unless otherwise indicated herein, the approaches described in this section are not prior art to the claims in this application and are not admitted to be prior art by inclusion in this section.

An overshoot pulse current may be added to a signal. For example, in a writer pre-amplifier design, a writer output signal is used to signal when to write to a disk for a disk drive. FIG. 1 depicts an example of a writer output signal 102. A writer output signal 102 includes a direct current (DC) writer current signal 104 that is combined with an overshoot pulse current signal 106. Overshoot pulse current signal 106 is generated using toggled pulse signals. The result of combining the two signals is writer output signal 102.

FIG. 2A depicts an example of a circuit 200 that is used to generate overshoot pulse current signal 106 and FIG. 2B depicts waveforms for circuit 200. Circuit 200 uses an inverter chain 202 to create a delay and generates pulse signals from an input clock (CLK). The output of a logic element 204 (e.g. an AND gate) is overshoot pulse current signal (BSTL) 106. Advantages of using inverter chain 202 to generate the pulse signals include simplicity, good signal integrity, and low power.

And gate 204 receives clock signal CLK and an inverted delayed clock signal CLKBD and creates overshoot pulse current signal 106. As shown in FIG. 2B, at 206, a rising edge of overshoot pulse current signal 106 is aligned with a rising edge of clock signal CLK. At 208, the falling edge of overshoot pulse current signal 106 is aligned with the falling edge of delayed clock CLKBD. This process continues as pulses are generated. The pulses may be toggled to be positive and negative to create overshoot pulse current signal 106.

In some designs, such as in a pre-amplifier writer design, using an inverter chain to generate pulses may be problematic. For example, a typical pulse width that is required for a pre-amplifier writer is programmable between 150 picoseconds (ps)-500 ps. However, the data rate of a writer current signal 104 exceeds 3 gigabits (gb) per second (ps), which gives a data duration of 333 ps. This results in a possible scenario where the pulse width of overshoot pulse current signal 106 may be selected to be larger than the data duration at a high data rate. For example, the pulse duration may be 400 ps, but the data duration is 333 ps. In this case, referring to FIG. 1, the overshoot pulse current signal 106 will be larger than the pulse of writer current signal 104. In this case, pulse signals will collapse.

FIG. 3 depicts an example when pulse signals collapse and are not aligned with clock signal CLK. When the delay is longer than the data duration, overshoot pulse current signal 106 is not aligned with clock signal CLK. For example, at 302, the value of clock signal CLK is 1 and the value of the inverted delayed clock signal CLKBD is 0, which results in a value of 0 being output by AND gate 204. At 304, the values of clock signal CLK and the inverted delayed clock signal CLKBD are both 1, and AND gate 204 outputs a high signal that results in the rising edge of overshoot pulse current signal 106. Thus, the rising edge of overshoot pulse current 106 is not aligned with clock signal CLK. To rectify the misalignment, techniques using circuits other than an inverter chain are used to generate the delay.

SUMMARY

In one embodiment, a method includes generating a first signal based on a clock signal and generating a second signal based on a programmable delayed clock signal. The method then generates a reset signal based on the first signal and the second signal. The clock signal is delayed using an inverter chain to generate a delayed version of the clock signal. An output signal is generated based on the delayed version of the clock signal and the reset signal. When a pulse width of the output signal is greater than a data duration determined from the clock signal, the pulse width of the output signal is reset to the pulse width of the data duration.

In one embodiment, when the pulse width of the output signal is less than the pulse width of the data duration, the pulse width of the output signal is not reset.

In one embodiment, the first signal is a pulse that is generated based on a rising edge of the clock signal.

In one embodiment, generating the output signal includes receiving the clock signal at a logic element; receiving the reset signal at the logic element; and determining the output signal based on values of the clock signal and the reset signal.

In one embodiment, an apparatus includes: circuitry configured to generate a first signal based on a clock signal; circuitry configured to generate a second signal based on a programmable delayed clock signal using an inverter chain; circuitry configured to delay the clock signal using an inverter chain to generate a delayed version of the clock signal; and circuitry configured to generate an output signal based on the delayed version of the clock signal and the reset signal, wherein when a pulse width of the output signal is greater than a data duration determined from the clock signal, the pulse width of the output signal is reset to the pulse width of the data duration.

The following detailed description and accompanying drawings provide a more detailed understanding of the nature and advantages of the present invention.

BRIEF DESCRIPTION OF THE DRAWINGS

FIG. 1 depicts an example of a writer output signal.

FIG. 2A depicts an example of a circuit that is used to generate an overshoot pulse current signal.

FIG. 2B depicts waveforms for the circuit depicted in FIG. 2A.

DETAILED DESCRIPTION

Described herein are techniques for a pulse generation circuit. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 3:
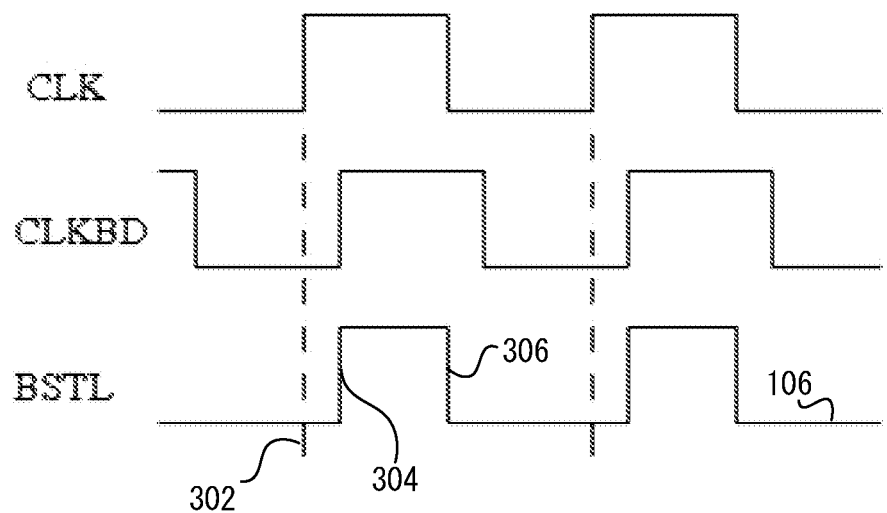
FIG. 3 depicts an example when pulse signals collapse and are not aligned with clock signal CLK.
Figure 4:
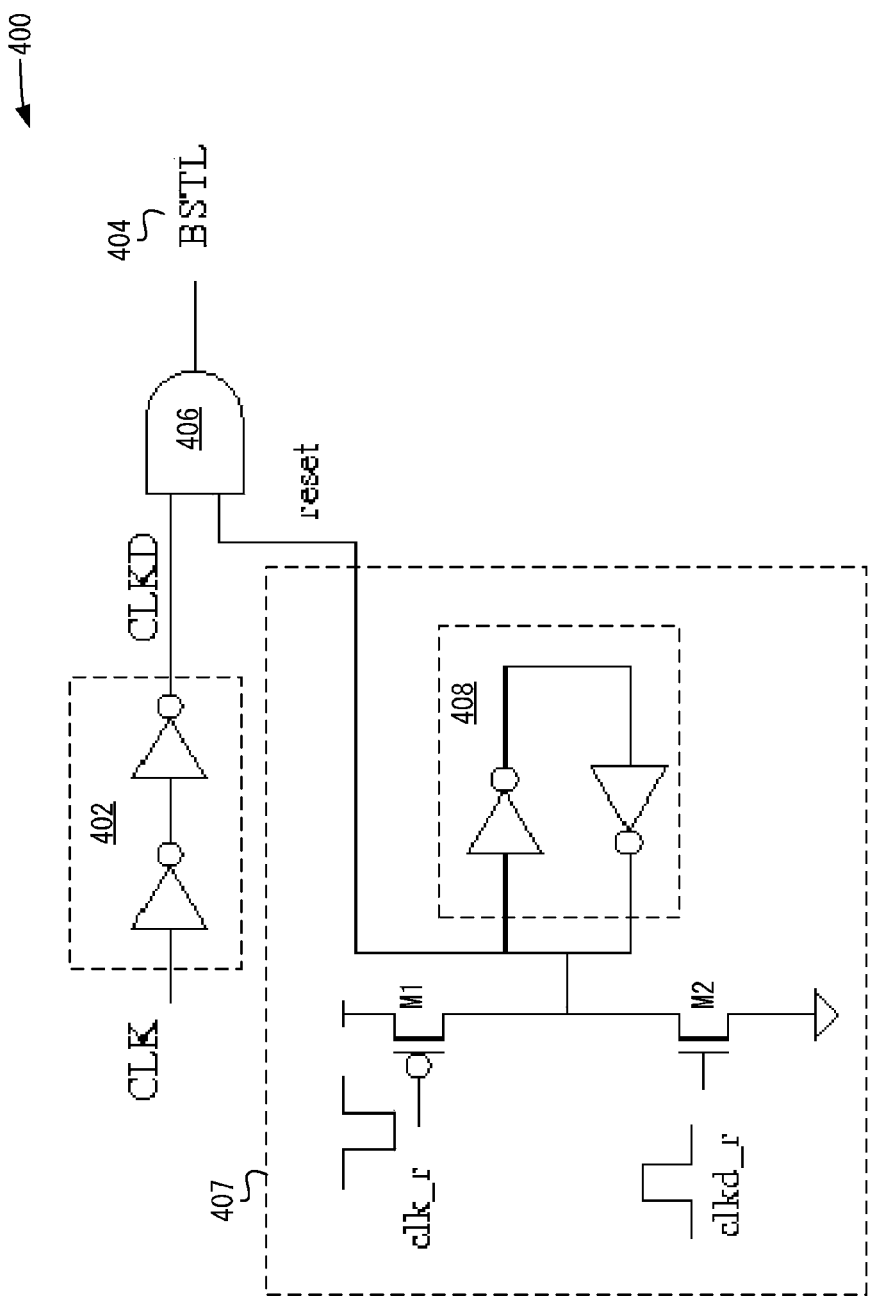
FIG. 4 depicts a pulse generation circuit using an inverter chain according to one embodiment.

FIG. 4 depicts a pulse generation circuit 400 using an inverter chain 402 according to one embodiment. In one embodiment, circuit 400 generates a pulse signal (BSTL) 404, which may be used as an overshoot current or for other purposes.

Circuit 400 includes inverter chain 402, a logic element 406 (e.g., an AND gate), and reset circuitry 407. Reset circuitry 407 resets a pulse width of pulse signal 404 to be the same as a data duration determined based the clock signal CLK (e.g., a data duration of a delayed clock signal CLKD) when the selected pulse width is larger than the data duration. The data duration may be a time period for a pulse of a clock signal. Also, the data duration may be a time when data is written to a disk drive.

Clock signal CLK is delayed by a standard delay to produce a delayed clock signal CLKD. For example, a two-inverter delay of clock signal CLK is used to produce delayed clock signal CLKD. CLKD is different from programmable delayed clock signal clkd. Programmable delayed clock signal clkd may be programmed based on a desired pulse width for writing data.

Reset circuitry 407 includes a first reset clock signal clk_r that is a short pulse created from a rising edge of clock signal CLK. First reset clock signal clk_r sets the reset signal to high at the rising edge of clock signal CLK. Second reset clock signal clkd_r is a short pulse created from a rising edge of a delayed programmable clock clkd. Second reset clock signal clkd_r brings the reset signal to low at a rising edge of programmable delayed clock clkd. A memory circuit 408 holds the value of the reset signal if there are no pulses from first reset clock signal clk_r or second reset clock signal clkd_r.

Figure 5:
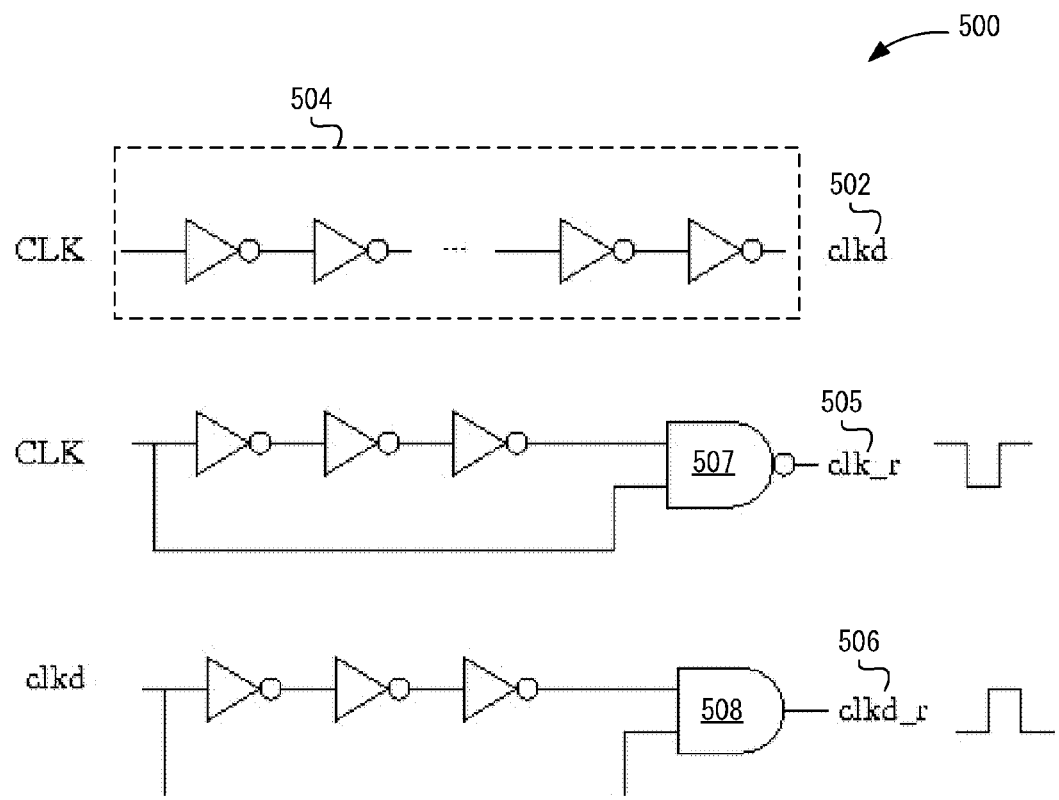
FIG. 5 depicts the generation of signals clkd, clk_r, and clkd_r according to one embodiment.

FIG. 5 depicts the generation of signals clkd, clk_r, and clkd_r according to one embodiment. At 502, a programmable delayed clock signal clkd can be programmed to a certain delay by including a different number of inverters 504. Programmable delayed clock signal clkd is a delayed version of clock signal CLK.

First reset clock signal clk_r is a short pulse based on the rising edge of clock CLK. At 505, a logic element (e.g., NAND gate) 507 receives an inverted delayed version of clock signal CLK and a non-delayed version of clock signal CLK. The output is a short pulse that begins at the rising edge of clock signal CLK.

At 506, second reset clock signal clkd_r is generated based on the rising edge of programmable delayed clock signal clkd. As shown, a logic element (AND gate) 508 receives an inverted delayed version of programmable delayed clock signal clkd and programmable delayed clock signal clkd. This results in a pulse that is generated at the rising edge of programmable clock signal clkd.

Figure 6:
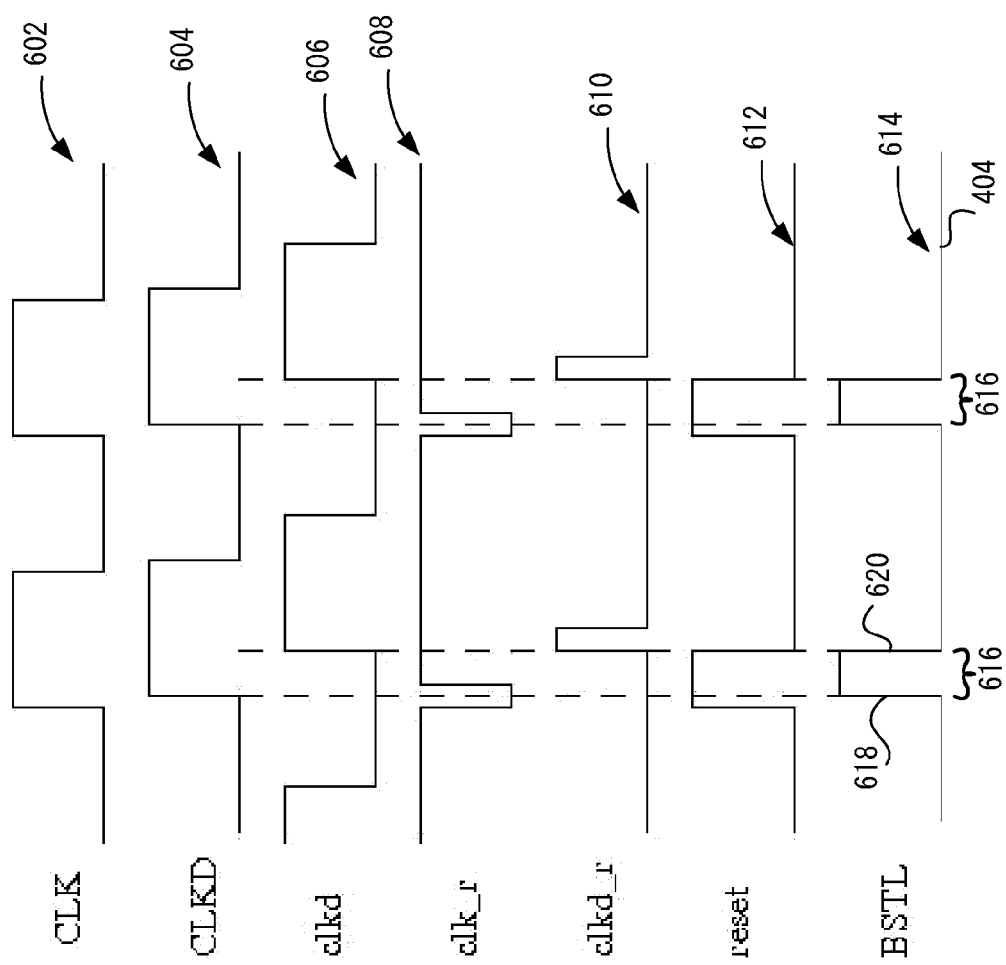
FIG. 6 depicts waveforms for circuit of FIG. 4 showing a first scenario where pulse width is smaller than a data duration according to one embodiment.

Two scenarios that may result are one where the pulse width is smaller than the data duration and one where the pulse width is larger than the data duration. FIG. 6 depicts waveforms for circuit 408 of FIG. 4 showing a first scenario where pulse width is selected to be smaller than a data duration according to one embodiment. At 602 and 604, the clock signal CLK and the delayed clock signal CLKD are shown. Delayed clock signal CLKD is a fixed delay from clock signal CLK. At 606, programmable delayed clock signal clkd is shown.

At 608, a pulse is created for first reset clock signal clk_r, and at 610, a pulse is created for second reset clock signal clkd_r. These pulses are generated based on the rising edges of delayed clock signal CLKD and programmable delayed clock signal clkd, respectively. At 612, a reset signal is shown. However, in this case, the reset signal is not used to reset the pulse width because the pulse width is smaller than the data duration.

At 614, pulse signal 404 is shown. At 616, the width of pulse signal 404 is determined by the rising edge of programmable delayed clock clkd. For example, at 618, pulse signal 404 goes high at the rising edge of delayed clock CLKD. At this point, delayed clock signal CLKD is high and the reset signal is high causing logic gate 406 to output a signal that is high. At 620, pulse signal 404 goes low at the rising edge of programmable delayed clock signal clkd. At this point, delayed clock signal CLKD is high and the reset signal is low causing logic gate 406 to output a signal that is low. Accordingly, as shown in FIG. 6, the reset signal reset has (i) a leading edge initiated by the leading edge of first reset signal clk_r and (ii) a trailing edge initiated by the leading edge of second reset clock signal clkd_r.

Figure 7:
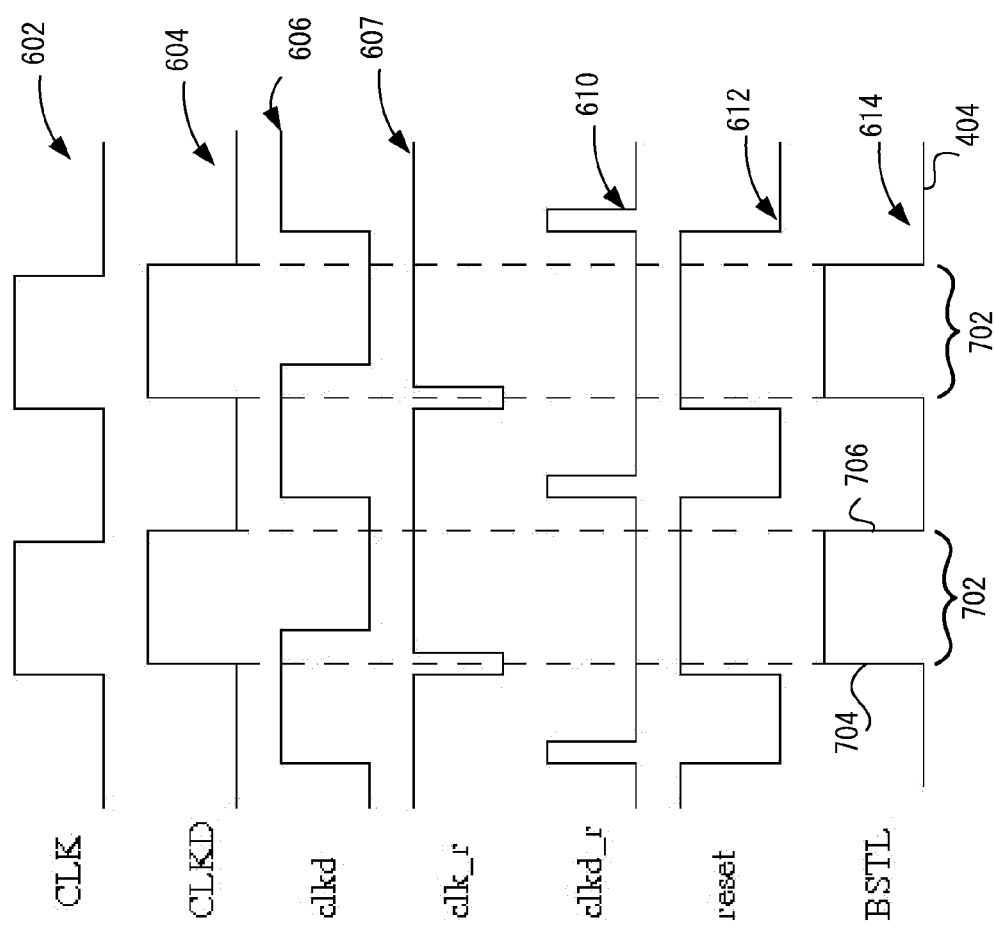
FIG. 7 depicts a second scenario where a pulse width of pulse signal is selected to be larger than a data duration according to one embodiment.

FIG. 7 depicts a second scenario where a pulse width of pulse signal 404 is selected to be larger than a data duration according to one embodiment. For example, programmable delayed clock signal clkd is set such that the pulse width of pulse signal 404 will be larger than the data duration. At 702, a pulse width of pulse signal 404 is the same width as delayed clock signal CLKD. In this case, the pulse width of pulse signal 404 is reset to be the same as the data duration of delayed clock signal CLKD.

At 704, the value of delayed clock signal CLKD is high and the value of the reset signal is high, which causes logic gate 406 to output a signal that is high. At 706, the value of delayed clock signal CLKD goes low. The value of the reset signal is high, however, and logic element 406 outputs a signal that is low. Thus, pulse signal 404 goes low. This resets the pulse width to the data duration. As shown in FIGS. 6 and 7, the duration of the output of the logic gate 406 equals the lesser of (i) the duration of the clock signal CLK and (ii) a difference of delay between delayed clock signal CLKD and programmable delayed clock signal clkd.

Referring back to FIG. 4, the operation of reset circuitry 407 will now be described to set the reset signal. It will be understood that other implementations may be used to generate the reset signal. When a pulse of first reset clock signal clk_r is generated, a first transistor M1 is turned on. This causes current to flow to logic element 406 and thus the reset signal is high. A memory circuit 408 holds the value when the pulse of first reset clock signal clk_r ends.

When a pulse of second reset clock signal clkd_r is received, a transistor M2 turns on. This causes the reset signal to go low by pulling current away from logic element 406. Memory circuit 408 holds the value when the pulse of second reset clock signal clkd_r is not present.

Figure 8:
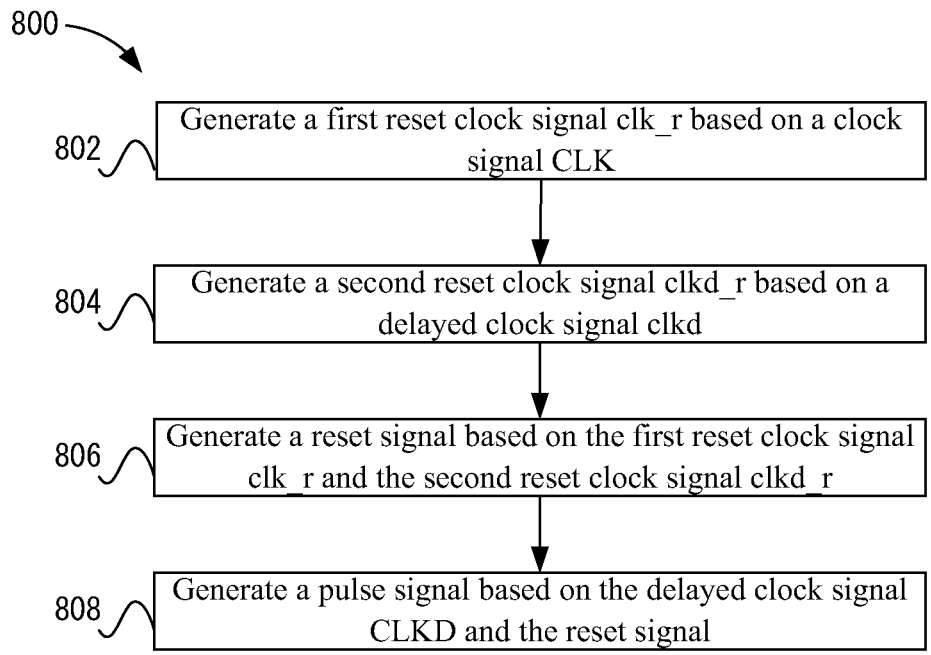
FIG. 8 depicts a simplified flowchart for generating a pulse signal according to one embodiment.

FIG. 8 depicts a simplified flowchart 800 for generating a pulse signal 404 according to one embodiment. At 802, a first reset clock signal clk_r is generated based on a clock signal CLK. At 804, a second reset clock signal clkd_r is generated based on a delayed clock signal clkd. At 806, a reset signal is generated based on the first reset clock signal clk_r and the second reset clock signal clkd_r. At 808, a pulse signal is generated based on the delayed clock signal CLKD and the reset signal.

A pulse width of pulse signal 404 is equal to a pulse width of a data duration of the delayed clock signal CLKD when the pulse width of pulse signal 404 is greater than the pulse width of the delayed clock signal CLKD. That is, the pulse width of pulse signal 404 is reset to the data duration. The data duration may be based on other versions of the clock signal CLK also.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A pulse generation circuit comprising:
   a clock input configured to receive a clock signal having a current clock pulse;
   a first delay circuit configured to add a first delay to the current clock pulse to generate a first delayed clock pulse;
   a second delay circuit configured to add a second delay to the current clock pulse to generate a second delayed clock pulse, wherein the second delay is longer than the first delay; and
   a logic circuit configured to generate an output pulse having
      a leading edge initiated by a leading edge of the first delayed clock pulse, and
      a trailing edge initiated by a first-occurring one of (i) a trailing edge of the first delayed clock pulse and (ii) a leading edge of the second delayed clock pulse;
   wherein a duration of the output pulse equals the lesser of (i) a duration of the current clock pulse and (ii) the second delay minus the first delay.

2. The pulse generation circuit of claim 1, wherein the logic circuit includes an AND gate that ANDs the first delayed clock pulse with a reset pulse derived from the second delayed clock pulse.

3. A pulse generation circuit comprising:
   a clock input configured to receive a clock signal having a current clock pulse;
   a first delay circuit configured to add a first delay to the current clock pulse to generate a first delayed clock pulse;
   a second delay circuit configured to add a second delay to the current clock pulse to generate a second delayed clock pulse, wherein the second delay is longer than the first delay;
   a reset circuit configured to generate a third reset pulse having (i) a leading edge initiated by a leading edge of a first reset pulse and (ii) a trailing edge initiated by a leading edge of a second reset pulse, wherein the reset circuit includes
      a first pulse-generating circuit configured to generate the first reset pulse based on the current clock pulse;
      a second pulse-generating circuit configured to generate the second reset pulse based on the second delayed clock pulse; and
   a logic circuit configured to AND the first delayed clock pulse with the third reset pulse generated by the reset circuit.

4. The pulse generation circuit of claim 3, wherein the first pulse-generating circuit is configured to generate the first reset pulse by ANDing the current clock pulse with a delayed version of the current clock pulse.

5. The pulse generation circuit of claim 3, wherein the second pulse-generating circuit is configured to generate the second reset pulse by ANDing the second delayed clock pulse with a delayed version of the second delayed clock pulse.

6. The pulse generation circuit of claim 1, wherein each of the first delay circuit and the second delay circuit includes a series of inverters.

7. The pulse generation circuit of claim 1, wherein the second delay circuit is configured for the second delay to be programmable.

8. The pulse generation circuit of claim 7, wherein the second delay is generated through a programmable number of inverters connected in series.

9. The pulse generation circuit of claim 1, wherein the output pulse is added as an overshoot current to another signal.

10. A method performable by an electrical circuit for pulse generation, the method comprising:
    receiving a clock signal having a current clock pulse;
    adding a first delay to the current clock pulse to generate a first delayed clock pulse;
    adding a second delay to the current clock pulse to generate a second delayed clock pulse, wherein the second delay is longer than the first delay; and
    generating an output pulse having
       a leading edge initiated by a leading edge of the first delayed clock pulse, and
       a trailing edge initiated by a first-occurring one of a (i) trailing edge of the first delayed clock pulse and (ii) a leading edge of the second delayed clock pulse;
    wherein a duration of the output pulse equals the lesser of (i) a duration of the current clock pulse and (ii) the second delay minus the first delay.

11. The method of claim 10, wherein generating the output pulse comprises ANDing the first delayed clock pulse with a reset pulse derived from the second delayed clock pulse.

12. A method performable by an electrical circuit for pulse generation, the method comprising:
    receiving a clock signal having a current clock pulse;
    adding a first delay to the current clock pulse to generate a first delayed clock pulse;
    adding a second delay to the current clock pulse to generate a second delayed clock pulse, wherein the second delay is longer than the first delay
    generating a first reset pulse based on the current clock pulse;
    generating a second reset pulse based on the second delayed clock pulse;
    generating a third reset pulse having (i) a leading edge initiated by the leading edge of the first reset pulse and (ii) a trailing edge initiated by the leading edge of the second reset pulse; and
    generating an output pulse by ANDing the first delayed clock pulse with the third reset pulse.

13. The method of claim 12, wherein the first reset pulse is generated by ANDing the current clock pulse with a delayed version of the current clock pulse.

14. The method of claim 12, wherein the second reset pulse is generated by ANDing the second delayed clock pulse with a delayed version of the second delayed clock pulse.

15. The method of claim 10, wherein each of the first delay and the second delay is implemented with a series of inverters.

16. The method of claim 10, wherein the second delay is programmable.

17. The method of claim 15, wherein the second delay is generated through a programmable number of inverters connected in series.

18. The method of claim 10, further comprising:
adding the output pulse as an overshoot current to another signal.

* * * * *